United States Patent [19]
Nagy

[11] Patent Number: 5,184,126
[45] Date of Patent: Feb. 2, 1993

[54] METHOD OF DECOMPRESSING COMPRESSED DATA

[75] Inventor: Michael E. Nagy, Tampa, Fla.

[73] Assignee: International Business Machines Corporation, Armonk, N.Y.

[21] Appl. No.: 458,116

[22] Filed: Dec. 28, 1989

[51] Int. Cl.[5] .............................................. H03M 7/40
[52] U.S. Cl. ...................................... 341/67; 341/51; 341/106; 341/65
[58] Field of Search .................... 341/51, 65, 67, 106, 341/107

[56] References Cited

U.S. PATENT DOCUMENTS

| | | | |
|---|---|---|---|
| 4,558,302 | 12/1985 | Welch | 341/51 |
| 4,701,745 | 10/1987 | Waterworth | 341/67 |
| 4,725,815 | 2/1988 | Mitchell et al. | 341/67 |
| 4,876,541 | 10/1989 | Storer | 341/67 |
| 4,881,075 | 11/1989 | Weng | 341/106 |
| 4,899,148 | 2/1990 | Sato et al. | 341/65 |
| 4,906,991 | 3/1990 | Fiala et al. | 341/51 |

*Primary Examiner*—A. D. Pellinen
*Assistant Examiner*—Marc S. Hoff
*Attorney, Agent, or Firm*—Jonathan E. Jobe; James H. Barksdale

[57] ABSTRACT

Disclosed is a method of decompressing data mode up of a sequence of literal references, history references, and lexicon references. The method includes the steps of reading a reference from the sequence and emitting a lexicon string if the reference is of the type lexicon, emitting a history string if the reference is of the type history, and emitting a literal string if the reference is of the type literal. The string emitted is inserted into a history buffer and if the string is of the type history it is inserted in a lexicon.

4 Claims, 2 Drawing Sheets

METHOD OF DECOMPRESSING COMPRESSED DATA

FIELD OF THE INVENTION

The present invention relates generally to data processing methods and more particularly to a method for decompressing compressed data in transmission or storage applications.

DESCRIPTION OF THE PRIOR ART

Compression is the coding of data to minimize its representation. Compression can be used, for example, to reduce the storage requirements for files, to increase the communication rate over a channel, or to reduce redundancy prior to encryption for greater security.

One method of data compression is disclosed in an article entitled, "A Universal Algorithm For Sequential Data Compression," by Ziv and Lempel, published in the IEEE Transactions on Information Theory, Vol. IT-23, No. 3, Pages 337-43, May 1977. The Lempel-Ziv algorithm is essentially a mechanism for back-referencing into the history of a data stream and substituting a shorthand code for the actual data when a match is found. Various implementations of Lempel-Ziv keep track of 512 (small-table), 1,024 (medium-table), and 4,096 (large-table) specific strings or back references in the lexicons or dictionaries. They vary in how the strings inserted into the lexicons are selected.

There are improvements to the basic Lempel-Ziv algorithm. One is the byte or character extension improvement, in which each string in the lexicon is the same as some other string in the lexicon with the addition of one or more byte at the end. Another is the string-extension Lempel-Ziv algorithm, in which each string in the lexicon is the concatenation of two other strings in the lexicon. Under most circumstances, the string-extension technique results in better compression.

The large-table string-extension Lempel-Ziv algorithm is generally considered to be an excellent general-purpose adaptive data compression technique. The cost of the large-table string-extension Lempel-Ziv technique is that it requires substantial memory and a fast central processing unit in the machine doing the compression. Decompression is relatively cheap in terms of both memory and processor cycles. In the context of the device that must support compression for many parallel data streams, memory is generally a greater problem than execution speed. This is because not all parallel data streams are simultaneously active, so CPU loading is rarely anywhere near worst case. Also, degradation of performance when excessive demands are made on the CPU is gradual and not catastrophic. This means that the number of data streams that a device may support is a weak function of the execution speed of the processor. In contrast, the memory dedicated to the adaptive compression tables must remain allocated even when the data streams are idle. This effectively limits the number of data streams that a particular device may support.

After the data has been compressed, it is necessary to decompress the compressed data before it can be used.

SUMMARY OF THE INVENTION

The decompression method of the present invention makes efficient use of two data structures, a history buffer and a lexicon. In this context a string is defined to be an ordered sequence of data symbols selected from a finite symbols set. The history buffer is a precise record of the uncompressed data that has most recently passed through the compressor. The lexicon is a set of strings of length one or greater.

The decompression method of the present invention operates by transforming an input data stream that includes a sequence of history references, lexicon references, and literal references into an output stream of symbols. The decompression method incrementally updates the history buffer and lexicon in such a way as to maximize the effectiveness of decompression. The decompression method receives enough information to reverse the transformation and exactly reconstruct the original data stream. No additional data is required by the decompressor beyond the compressed data stream itself.

In the method of the present invention, references are sequentially read from the input data stream. If the reference read is a lexicon reference, than the lexicon string represented by the lexicon reference is emitted. If the reference read is a history reference, then the history string represented by the history reference is emitted. If the reference is a literal reference, then the symbol represented by the literal reference is emitted. If a history string is emitted, then that string is inserted into the lexicon. Each string emitted, whether it be a history string, lexicon string, or a literal symbol, is appended to the history buffer. The references are read sequentially from the input data stream until they are exhausted.

DESCRIPTION OF THE PREFERRED EMBODIMENT

Figure 1:
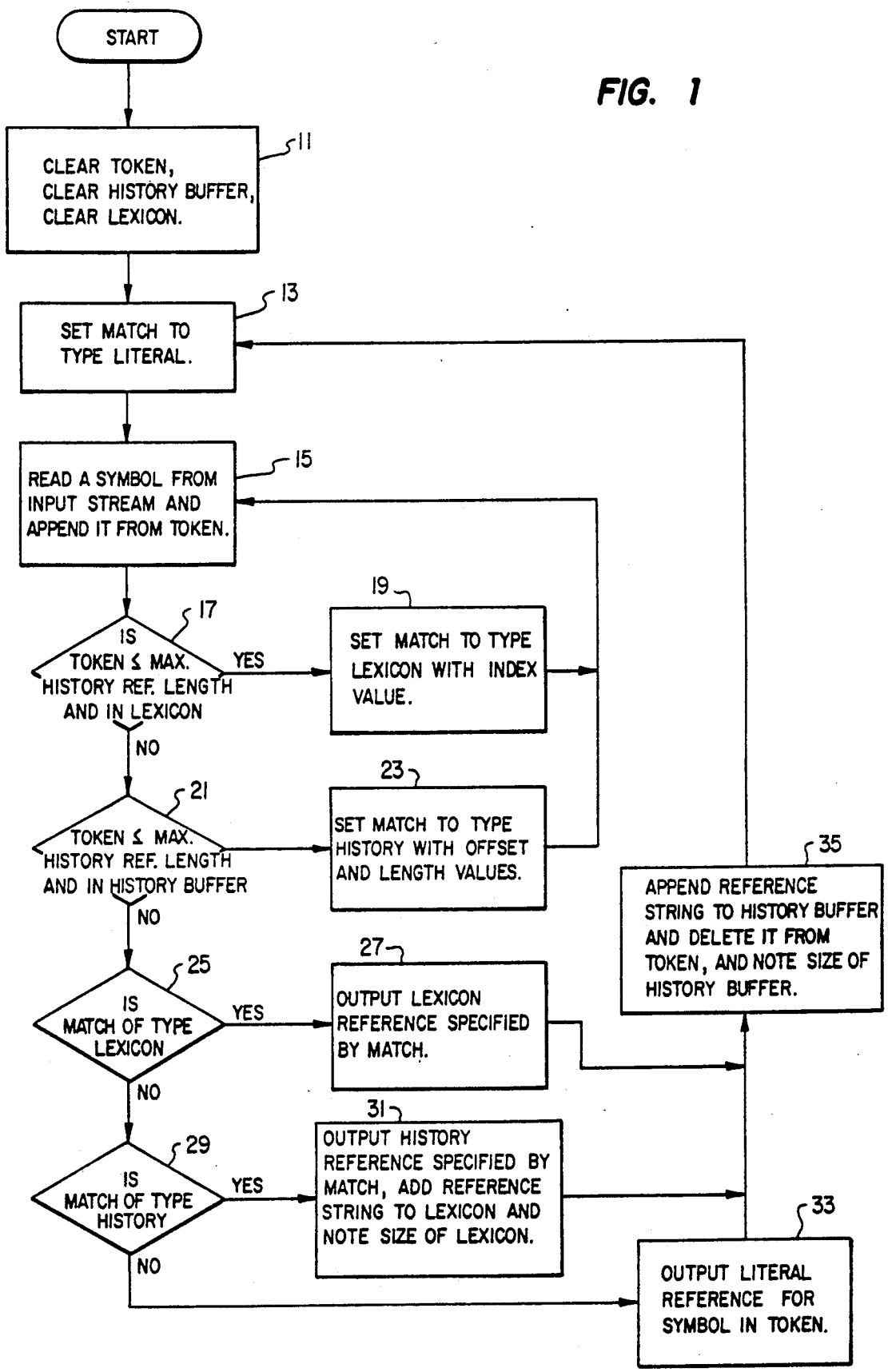
FIG. 1 is a flow chart showing the compression method of the present invention.

The compression method of the present invention is depicted in FIG. 1. The initial steps of the compression method of the present invention are shown in block 11, and they consist of clearing a history buffer, a lexicon, and a token. The token is a working sub-string to which symbols of the sequence of data are appended. The token, history buffer, and lexicon are initially empty.

The history buffer is implemented as a linear array of symbol values indexed with positive integers starting from a base of 0. The length of the history buffer is fixed at a certain value. Preferably, the length of the history buffer is an exact power of 2. In the preferred embodiment, a history buffer length of 2,048 8-bit bytes works well for many types of binary data files and text files.

Any string of symbols in the history buffer may be uniquely specified by a history reference that includes an offset value and a length value. The offset value is defined to be the index into the buffer of the first symbol in the reference string. The length value is the number of symbols that belong to the reference string starting with the symbol identified by the offset. Preferably, a maximum history reference length value is selected. The maximum obtainable compression ratio rises in direct relationship to this value, but on any particular type of data stream there is an optimum value beyond which the average compression ratio will begin to drop due to the excessive size of the encoded length values relative to the average number of characters in each match. Exact powers of two are favored because the number of bits necessary to encode a match does not change between successive powers of two. Therefore, it is a waste of potential compression ratio not to peg the length value up to the next exact power of two. It has been found that a maximum history reference length of sixteen 8-bit bytes works well in conjunction with the 2,048 character history buffer of the preferred embodiment.

The lexicon is implemented as a simple array of elements each of which can hold a string with from one symbol to the number of symbols specified by the maximum history reference length. During compression, strings are looked up in the lexicon using an auxiliary hash table. The auxiliary hash table should contain several times as many elements as the lexicon itself to assure that the hash table remains sparse and efficient. It has been found that a lexicon size of 1,024 works well in conjunction with the 2,048 byte history buffer of the preferred embodiment of the invention. A lexicon of this size should be supported by a hash table with at least 2,048 entries to avoid excessive numbers of hash table collisions.

Hash tables are well known to those skilled in the art, and they are formed by performing a mathematical operation on the symbols that comprise the string to be looked up in the table. The mathematical operation yields a single integer in the range of valid hash table indices. The hash table entry at that index contains the index of the corresponding entry in the lexicon. This level of indirection allows for efficient assignment of lexicon entry indices during the early phases of compression when the lexicon is almost empty. By filling the lexicon in an orderly fashion starting at the first entry and building up to higher entries, it is possible to take advantage of the smaller number of bits needed to transmit index values during this phase.

By keeping the hash table sparse relative to the lexicon itself, it is possible to achieve excellent Performance without the need for any form of overflow chaining when multiple strings hash to the same hash table index. When this occurs, it is called a hash table collision. Such collisions are handled by discarding the old data and replacing it with new data as necessary. A least-recently-used queue of linked lexicon entries is used in conjunction with a hash table to facilitate insertion and deletion of lexicon entries when the lexicon finally fills up. When forced to discard an entry in the fixed-sized lexicon to make room for a new one, it is better to throw away an entry that has not been used for a long time. The least-recently-used queue allows this to be done efficiently.

As shown in block 13, the next step of the compression method of the invention involves setting the match equal to the type literal. Match may be either literal, history, or lexicon, depending upon whether a string of symbols is duplicated in the history buffer or the lexicon. If the string is not duplicated in either the history buffer or the lexicon, then the match defaults to the type literal.

As shown in block 15, the next steps of the compression method of the present invention include reading a symbol from the input string and appending the symbol to the token. Initially, the token consists of a single character; however, as the method of the present invention proceeds and the history buffer and lexicon are filled, the token may consist of a string of several characters. As shown in decision block 17, the token is compared to the contents of the lexicon. Initially, the lexicon is empty so no match will be found. However, after the method of the present invention proceeds for awhile, strings will be inserted into the lexicon and matches may be found. If a match is found in the lexicon, then, as shown in block 19, the match is set to the type lexicon with a corresponding index value and, returning to block 15, another symbol from the input sequence is read and it is appended to the token.

If the token is not duplicated in the lexicon, then, at decision block 21, the token is compared to the contents of the history buffer. Again, since the history buffer is initially empty, no match will be found in the history buffer. However, after the compression method of the present invention has proceeded for awhile, the token may be duplicated in the history buffer. If the token is duplicated in the history buffer, then, as shown in block 23, the match is set to the type history with offset and length values and, returning to block 15, another symbol is read from the input string and it is appended to the token. Then, the token is again compared to the contents of the lexicon at block 17. The compression method of the present invention continues, as long as the token is equal to or less than the maximum history reference length value, to add symbols to the token and compare the token to the contents of the lexicon and the history buffer until the token is duplicated in neither the lexicon nor the history buffer. The method thus forms the longest allowable string of characters that is duplicated in either the lexicon or the history buffer. The longest string of characters consists of the token less its final character. For purposes of this disclosure, a single literal is considered to be a string.

After the compression method of the present invention has formed the longest allowable string, then the method emits a reference that symbolizes the string. As shown in decision block 25, if the match is of the type lexicon, then, as shown in block 27, the lexicon reference specified by the match is output or emitted. If the match is not of the type lexicon, then it is either of the type history or literal and, as shown in decision block 29, if the match is of the type history, then as shown in block 31, the history reference specified by the match is emitted for output. Also, when the match is of the type history, the reference string specified by the history reference is added to the lexicon and the size of the lexicon is noted.

If the match is not of the type history, then it is of the type literal. As shown in block 33, a literal reference for the symbol in the token is emitted or output. After the lexicon reference, history reference, or literal reference has been emitted, as shown in block 35, the reference string is appended to the history buffer and deleted from the beginning of the token. Also, the size of the history buffer is noted. The token is then returned to block 13 and the process is continued until the input sequence of symbols is exhausted.

Based on probabilistic studies of typical data streams, the following encoding scheme has been found to yield close to optimal results:

| | |
|---|---|
| LITERAL REFERENCE | 0+ SYMBOL |
| HISTORY REFERENCE | 1+0+ OFFSET+LENGTH |
| LEXICON REFERENCE | 1+1+ INDEX |

"1" and "0" represent single binary digits and OFFSET, LENGTH, and INDEX are encoded in the minimum number of bits necessary to represent their maximum potential values at any particular instant. Specifically, the number of bits required is equal to the radix2 logarithm of the maximum potential value rounded up to the nearest exact power of 2. If, for example, the lexicon contains 12 entries, then the number of bits necessary to encode an index value would be 4 because 12 would round up to 16 (the next power of 2), and the radix2 logarithm of 16 is 4. SYMBOL is the 8-bit representation of the symbol itself.

The data entering the compressor of the present invention is handled as 8-bit bytes, but the data flowing out of the compressor is a free-form bit stream. The foregoing encoding rules for literal references, history references, and lexicon references allow this free-form bit stream to be easily and unambiguously parsed by the decompressor.

In typical application environments, the number of bits required to encode each literal symbol will be equal to the basic block size of the serial communication channel that interconnects the compressor and decompressor. In an EBCDIC environment, for example, symbol values are encoded using 8-bits and the basic information unit flowing on a typical communication link is quantized into 8-bit characters. Because the number of bits required to encode a literal reference is always one greater than the basic block size on such a link, it is always possible to force any unused bits after the end of the last valid character to be ignored by the decompressor by adding a single zero bit after the end of the final valid reference if there are any additional bits available in the final data block. By using a zero bit to mimic the start of the literal reference, knowing that the reference cannot be completed due to the truncation of the compressed data stream at the next block boundary, the decompressor will automatically ignore any extra bits in the last data block. In other words, when the decompressor "sees" a zero bit, it will expect to see an 8-bit literal. When the zero bit is followed by nothing, the decompressor "knows" that the sequence is complete.

Figure 2:
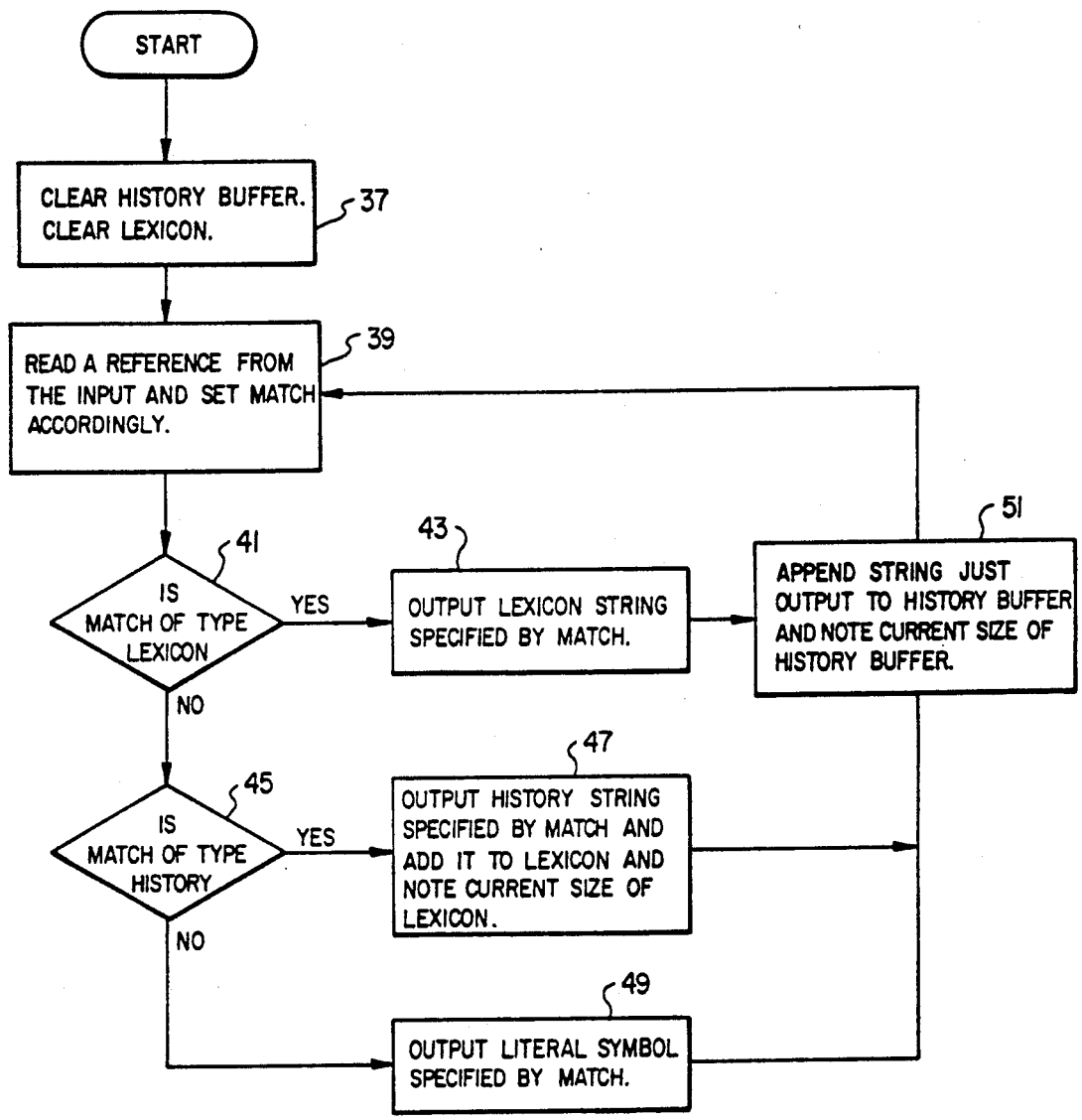
FIG. 2 is a flow chart showing the decompression method of the present invention.

Referring now to FIG. 2, there is shown a flow diagram of the decompression method of the present invention. As shown in block 37, the first steps are clearing the history buffer and lexicon. The history buffer and the lexicon of the decompressor have the same structure of those of the compressor, as described above. After the history buffer and lexicon have been cleared, then, referring to block 39, a reference is read from the input and the match is set accordingly. If the first bit of the reference is a zero, then the match is of the type literal. If the first bit of the reference is a 1, then the match is either of the type lexicon or history. If the bit following the 1 is a zero, then the match is of the type history. If the bit following the 1 is a 1, then the match is of the type lexicon.

As shown in the decision block 41, if the match is of the type lexicon, then, as shown in block 43, the lexicon string specified by the match is output.

If the match is not of the type lexicon then, referring to decision block 45, if the match is of the type history, then referring to block 47, the history string specified by the match is output and the string is added to the lexicon and the current number of lexicon entries is noted. If the match is neither of the type lexicon nor the type history, then referring to block 49, the literal symbol specified by the match is output. Finally, after the string specified by the match in blocks 43, 47, or 49, is output, that string is appended to the history buffer as shown in block 51, and the current size of the history buffer is noted, whereupon the process is repeated until the input stream is exhausted.

Initially, the lexicon and history buffer of the decompressor are empty. However, the first references received by the decompressor will be of the type literal. As the literal references are processed, they are added to the history buffer. When the compressor finds a match in its history buffer, the compressor will emit a history reference. Since the history buffers in the compressor and decompressor are identical, the history reference will identify the proper string of symbols in the decompressor's history buffer. Upon the emission by the compressor and receipt by the decompressor of a history reference, the string referred to by that history reference is inserted into the respective lexicons of the compressor and decompressors.

The method of the present invention thus uses two data structures, a history buffer and a lexicon, to achieve efficient compression of a data stream. By limiting the history buffer to a fixed depth, the maximum length of a history reference to a relatively small value, and the maximum number of entries in the lexicon to a fixed number, it is possible to design an interrelated set of data structures that utilize memory in a highly efficient manner and produce compression ratios comparable to methods requiring substantially more memory.

While the invention has been particularly shown and described with reference to a preferred embodiment, it will be understood by those skilled in the art that various changes in form and detail may be made without departing from the spirit and scope of the invention.

What is claimed is:

1. A method of decompressing data made up of a sequence of literal references, history references, and lexicon references, which comprises the steps of:
    a) reading a reference from said sequence;
    b) emitting a lexicon string if said reference is a lexicon reference;
    c) emitting a history string if said reference is a history reference;
    d) adding the history string emitted in step c to a lexicon;
    e) emitting a literal string if the reference is a literal reference;
    f) adding the string emitted in step b, c or e to a history buffer; and,
    g) repeating steps a through f until said sequence of references is exhausted.

2. The method as claimed in claim 1, wherein said lexicon reference includes an index value.

3. The method as claimed in claim 1, wherein said history reference includes an offset into said history buffer and a length value.

4. The method as claimed in claim 1, wherein said history buffer is of a fixed length.

* * * * *